United States Patent
Parekh et al.

[19]

[11] Patent Number: 6,027,967
[45] Date of Patent: Feb. 22, 2000

[54] METHOD OF MAKING A FIN-LIKE STACKED CAPACITOR

[75] Inventors: Kunal R. Parekh, Boise; Zhiqiang Wu; Li Li, both of Meridian, all of Id.

[73] Assignee: Micron Technology Inc., Boise, Id.

[21] Appl. No.: 08/887,744

[22] Filed: Jul. 3, 1997

[51] Int. Cl.[7] .................. H01L 21/8242; H01L 21/8234; H01L 21/8244; H01L 21/20
[52] U.S. Cl. .................... 438/254; 438/253; 438/238; 438/239; 438/255; 438/381; 438/397
[58] Field of Search ..................... 438/238, 239, 438/253, 254, 210, 329, 379, 381, 397, 171, 190

[56] References Cited

U.S. PATENT DOCUMENTS

| | | | |
|---|---|---|---|
| 4,093,503 | 6/1978 | Harris et al. | 156/628 |
| 4,571,817 | 2/1986 | Birritella et al. | 437/18 |
| 5,153,813 | 10/1992 | Oehrlein et al. | 361/313 |
| 5,160,987 | 11/1992 | Pricer et al. | 257/307 |
| 5,358,908 | 10/1994 | Reinberg et al. | 437/228 |
| 5,484,740 | 1/1996 | Cho | 437/40 |
| 5,532,182 | 7/1996 | Woo | 437/52 |
| 5,637,523 | 6/1997 | Fazan et al. | 438/397 |
| 5,721,152 | 2/1998 | Jenq et al. | 437/52 |
| 5,753,948 | 5/1998 | Nguyen et al. | 257/307 |
| 5,817,553 | 10/1998 | Stengl et al. | 438/253 |
| 5,851,876 | 12/1998 | Jenq | 438/253 |
| 5,869,367 | 2/1999 | Fazan et al. | 438/253 |

OTHER PUBLICATIONS

Schnakenberg et al., TMAHW Etchants for Silicon Micromachining, 91CH2817–5/91/000–0815,IEEE,815–818, 1991.

G.L. Kuhn et al., Thin Silicon Film on Insulating Substrate, J. Electrochem. Soc. Solid State Science and Technology, vol. 120, No. 11, 1563–1566, 1973.

Super Q Etch, Olin Electronic Materials, Olin Corporation, Chandler, AZ (1993).

Box Cell, Toshiba.

*Primary Examiner*—John F. Niebling
*Assistant Examiner*—Neal Berezwy
*Attorney, Agent, or Firm*—Workman, Nydegger & Seeley

[57] ABSTRACT

A method of making a capacitor comprising providing a space extending between a pair of gate stacks on a semiconductor substrate, the space exposing a charge conducting region on the semiconductor substrate. A BPSG layer is formed over the pair of gate stacks. A hard mask layer comprising alternating layers of doped polysilicon and undoped polysilicon is formed over the BPSG layer during a single deposition cycle of depositing polysilicon. Portions of the hard mask layer and the BPSG layer are selectively removed to form topographical structures extending above the gate stacks and having a trench therebetween. A spacer etch and a contact etch are performed to expose the charge conducting region. A doped polysilicon spacer is formed on the lateral side of each topographical structure. A second group of alternating layers of doped polysilicon and undoped polysilicon is formed over the topographical structures and within the trench. Portions of the hard mask layer and the second group of the alternating layers of doped polysilicon and undoped polysilicon are selectively removed. An etch selective to the doped polysilicon is performed to selectively remove the undoped polysilicon to create a structure with spaced apart doped polysilicon layers. A dielectric layer and an electrically conductive cell plate are formed over the alternating layers of the doped polysilicon and the undoped polysilicon. The semiconductor substrate is heated to diffuse dopant in the doped polysilicon into the undoped polysilicon. The resultant novel capacitor has a fin-like structure extending therefrom which increase the surface area thereof.

35 Claims, 8 Drawing Sheets

METHOD OF MAKING A FIN-LIKE STACKED CAPACITOR

BACKGROUND OF THE INVENTION

1. The Field of the Invention

The present invention relates to methods of forming a conductive structure over a charge conducting region. More particularly, the present invention relates to methods of forming a vertically oriented structure composed of conductive material projecting from a charge conducting region. The method of the present invention is particularly useful for forming a capacitor storage node between two gate stacks situated on a semiconductor substrate.

2. The Relevant Technology

Integrated circuits provide the logic and memory of computers and other intelligent electronic products. Electronic "chips" on which the integrated circuits are situated have advanced in capability to a level that has made the computers and other intelligent electronic devices highly functional. Integrated circuits are also being manufactured economically, allowing the highly functional computers and other intelligent electronic products to be provided to consumers at an affordable cost.

Integrated circuits are currently manufactured by an elaborate process in which semiconductor devices, insulating films, and patterned conducting films are sequentially constructed in a predetermined arrangement on a semiconductor substrate. In the context of this document, the term "semiconductor substrate" is defined to mean any construction comprising semiconductive material, including but not limited to bulk semiconductive material such as a semiconductive wafer, either alone or in assemblies comprising other materials thereon, and semiconductive material layers, either alone or in assemblies comprising other materials. The term "substrate" refers to any supporting structure including but not limited to the semiconductor substrates described above.

Conventional semiconductor devices which are formed on a semiconductor substrate include capacitors, resistors, transistors, diodes, and the like. In advanced manufacturing of integrated circuits, hundreds of thousands of these semiconductor devices are formed on a single semiconductor substrate.

The computer and electronics industry is constantly under market demand to increase the speed at which integrated circuits operate, to increase the capabilities of integrated circuits, and to reduce the cost of integrated circuits. One manner of accomplishing this task is to increase the density with which the semiconductor devices can be formed on a given surface area of a single semiconductor substrate. In so doing, the semiconductor devices must be decreased in dimension in a process known as miniaturization. In order to meet market demands and further the miniaturization of integrated circuits, the processes by which the semiconductor devices are formed are in need of improvement. The challenge in miniaturizing integrated circuits is to do so without greatly increasing the cost of the processes by which integrated circuits are manufactured. Accordingly, the new processes must also be relatively simple and cost effective.

One structure which is frequently formed in integrated circuit manufacturing and for which improved methods of formation are needed is the capacitor. The capacitor is formed with a storage node, a cell plate, and a dielectric layer therebetween. The storage node and the cell plate are typically patterned out of polysilicon by conventional photolithography and dry etching. The dielectric layer is formed in an intervening process between the formation of the storage node and the cell plate, typically by growth of silicon dioxide through exposure of the polysilicon of the storage node to oxygen at an elevated temperature.

An important consideration in forming capacitors in integrated circuits is surface area. A large surface area of the storage node and cell plate is necessary in order to provide high capacitance and therefore optimal performance of the capacitor. Balanced against this need is the competing requirement that the capacitor also occupy a minimum of space on the semiconductor substrate on which the capacitor is formed. One manner in which the semiconductor industry has approached minimal space capacitor formation is to form the capacitor at a significant distance above the semiconductor substrate.

A typical arrangement of the basic structure used in the formation of a memory cell is a silicon substrate with a plurality of source/drain regions therein, where a pair of gate stacks are situated on the silicon substrate, the pair of gate stacks having a capacitor therebetween. Miniaturization demands require that the gate stacks be closely spaced together.

Typically in the formation of a capacitor, a storage node is formed above a source/drain region and projects upwards therefrom. To form the storage node, a layer of insulating material, such as borophosphosilicate glass (BPSG), is formed over the gate stacks and the source/drain region therebetween. A polysilicon layer deposited over the insulating layer is patterned and etched to form trenches in the insulating layer. A spacer comprising polysilicon is formed by a spacer etch in the trench to narrow the trench to the necessary size. After the spacer etch and a subsequent contact etch, the trenches extend to the silicon substrate.

Usually, a layer of doped polysilicon is formed over the exposed structures and within the trenches. A chemical mechanical planarization (CMP) process planarizes the insulating layer which results in an electrically insulated conductive structure which is used to form a storage node for a capacitor. A dielectric layer and a cell plate are formed over the storage node to complete a capacitor structure.

Current processing to form the capacitor described above requires multiple depositions. What is needed is a capacitor structure that can be formed with a minimized number of depositions so as to reduce both cost and throughput time. A reduction in the masks required is also desired. It is desirable to reduce the number of separate process steps, thereby increasing the through put rate.

SUMMARY OF THE INVENTION

Additional advantages of the invention will be set forth in the description which follows, and in part will be obvious from the description, or may be learned by the practice of the invention. The advantages of the invention may be realized and obtained by means of the combinations particularly pointed out in the appended claims.

In accordance with the invention as embodied and broadly described herein, a pair of structures projecting from a semiconductor substrate are provided. A layer of a material is formed on an electrically active area within the semiconductor substrate and in between and in contact with an electrically insulative material on each of the pair structures. During the formation of the layer of material, a dopant is introduced for doping the material being formed while varying the concentration of the dopant being introduced. The dopant can be introduced in a gas form or by ion implantation. As such, the layer of the material is formed into alternating substantially doped and substantially undoped portions. Then, the layer is selectively removed at a material removal rate that is faster for either the substantially doped or the substantially undoped portions. An alternating doped and undoped structure is thereby formed, wherein there is a greater exposed surface area for one of the substantially doped and undoped portions that was selectively removed at a lower material removal rate than the other.

One embodiment of the inventive method, which, can be used to make a capacitor, comprises providing a space extending between a pair of gate stacks on a semiconductor substrate to expose a charge conducting region formed therein. A BPSG layer is formed within the space and over the pair of gate stacks. The BPSG layer substantially fills the space between the gate stacks. A hard mask layer comprising a first group of alternating layers of doped polysilicon and undoped polysilicon is formed over the BPSG layer. The first group of the alternating layers of doped polysilicon and undoped polysilicon is formed during one deposition cycle in which polysilicon is deposited while a supply of dopant to the deposition cycle is alternatingly increased and decreased. Stated otherwise, the dopant is alternatingly turned substantially on and substantially off. The inventive method also contemplates doping the polysilicon by an ion implanting process for implanting ions of the dopant within the polysilicon.

Each layer of the first group of the alternating layers of doped polysilicon and undoped polysilicon preferably has a thickness of about 1000 Å. A portion of the hard mask layer and a portion of the insulating layer are selectively removed to form topographical structures having a trench therebetween. A layer of in situ doped polysilicon is deposited over the topographical structures and in the trench therebetween. The BPSG layer and a portion of said layer of in situ doped polysilicon are spacer etched to form a doped spacer on the lateral side of each topographical structure formed by the hard mask layer. The doped spacer is capable of acting as part of the hard mask layer because the spacer etch is selective to the doped polysilicon.

The semiconductor substrate is then subjected to a contact etch in which the trench between the topographical structures is extended to the semiconductor substrate so as to expose the charge conducting region. A second group of alternating layers of doped polysilicon and undoped polysilicon is formed over the topographical structures and in the trench during one deposition cycle. A portion of the hard mask layer and a portion of the second group of alternating layers of doped polysilicon and undoped polysilicon are selectively removed thereby forming an electrically insulated storage node. A portion of the undoped polysilicon layers are selectively removed utilizing an etchant selective to the doped polysilicon layer which results in the doped polysilicon layers having a spaced apart relationship. A dielectric layer is formed over the alternating layers of doped polysilicon. The dielectric layer may be composed of silicon nitride. An electrically conductive cell plate is formed upon the dielectric layer. The semiconductor substrate may optionally be heat treated to diffuse the doped polysiliCon into the undoped polysilicon such that the storage node is substantially composed of doped polysilicon.

A novel capacitor is also disclosed. The novel capacitor is formed upon a semiconductor substrate having an active area deposed therein that is adjacent to a pair of raised structures, such as gate stacks. A layer of insulating material is formed upon the semiconductor substrate, over the active area, an over the pair of raised structures. The layer of insulating material has a recess formed extending to the semiconductor substrate at the active area. A plurality of alternating layers of doped polysilicon and undoped polysilicon are disposed substantially conformably upon the semiconductor substrate within the recess. A portion of one of either of the layers of doped polysilicon or of the layers of undoped polysilicon have a spaced apart relationship. A dielectric layer overlays the alternating layers of doped polysilicon and undoped polysilicon. An electrically conductive cell plate is formed over said dielectric layer to complete the novel capacitor.

BRIEF DESCRIPTION OF THE DRAWINGS

In order that the manner in which the above-recited and other advantages and objects of the invention are obtained, a more particular description of the invention briefly described above will be rendered by reference to specific embodiments thereof which are illustrated in the appended drawings. Understanding that these drawings depict only typical embodiments of the invention and are not, therefore, to be considered to be limiting of its scope, the invention will be described and explained with additional specificity and detail through the use of the accompanying drawings in which.

DETAILED DESCRIPTION OF THE PREFERRED EMBODIMENTS

The present invention relates to a vertically oriented structure composed of conductive material projecting from a charge conducting region which is particularly useful in forming a capacitor storage node between two gate stacks situated on a semiconductor substrate. One application of the method of the present invention is to form a capacitor useful in a dynamic random access memory cell.

Figure 1:
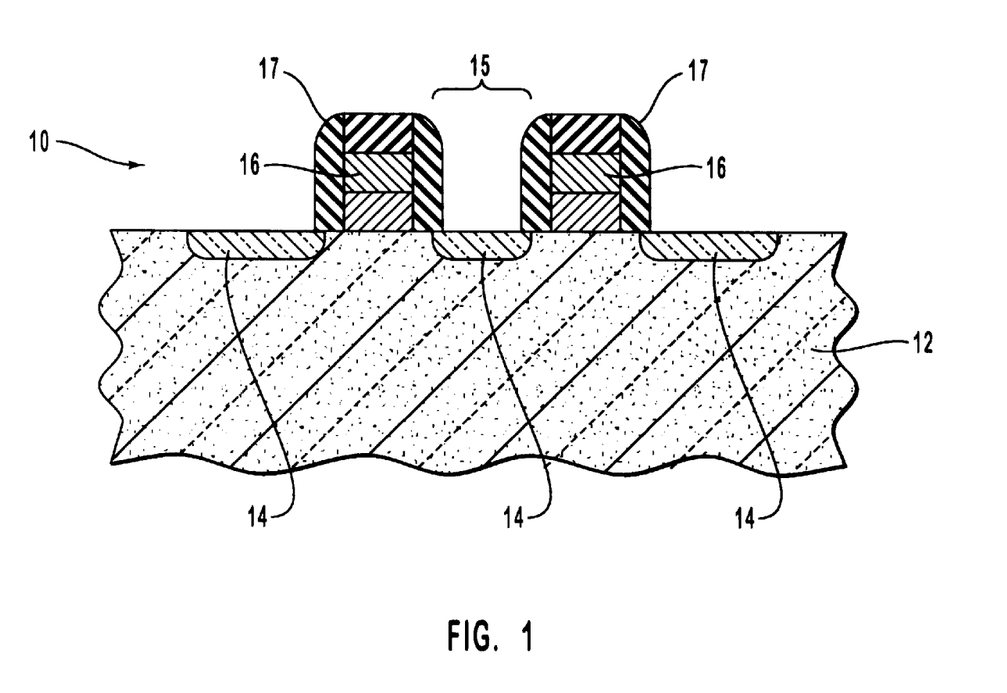
FIG. 1 is a partial cross-sectional elevation view of a semiconductor substrate showing a pair of gate stacks on a silicon base layer adjacent to a source/drain region formed within the silicon base layer.

Semiconductor substrate 10 is formed with a silicon base layer 12 on which are located a plurality of charge conducting regions shown in FIG. 1 as source/drain regions 14. FIG. 1 illustrates a semiconductor substrate 10 as a silicon wafer; however, any suitable type of semiconductor substrate may be used such as silicon on insulator (SOI), silicon on sapphire (SOS) and the like. A pair of gate stacks is generally seen at reference number 16. Gate stacks 16 are formed on silicon base layer 12 with a source/drain region 14 therebetween. Each gate stack 16 is covered with an insulating protective spacer 17. Protective spacer 17 is preferably composed of silicon dioxide or silicon nitride.

Gate stacks 16 define therebetween a space 15 over source/drain region 14. Of course, space 15 could be formed in other embodiments over other types of charge conducting regions and between adjoining structures other than gate stacks 16.

Figure 2:
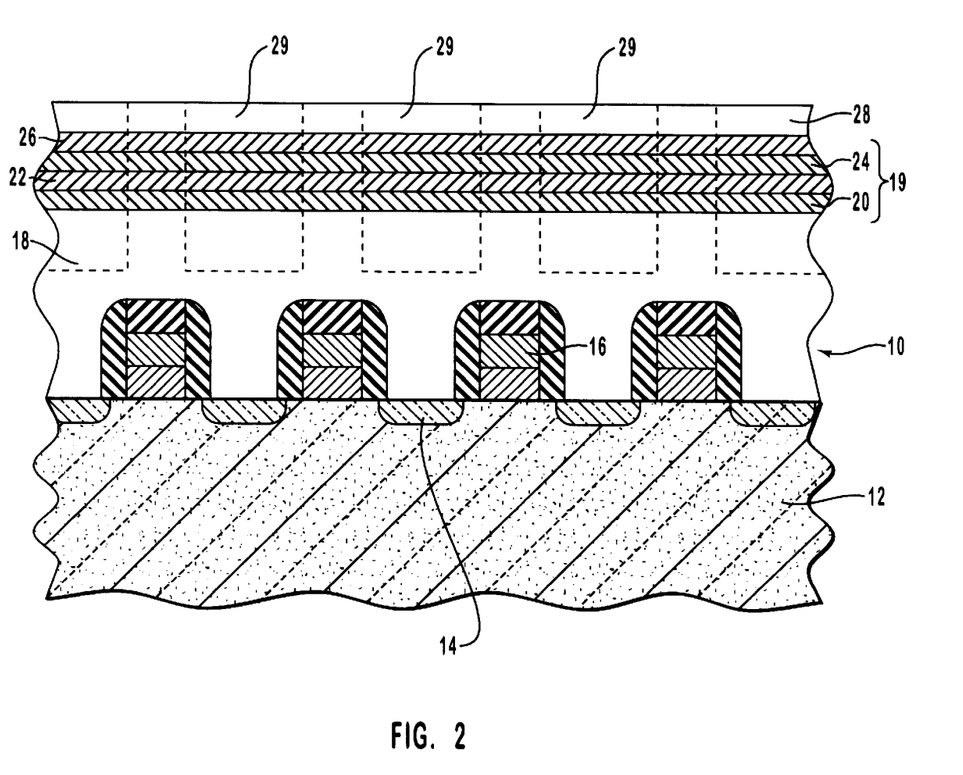
FIG. 2 is a partial cross-sectional elevation view of the structure of FIG. 1, further showing an insulation layer over the pair of gate stacks and including alternating layers of doped material and undoped material formed on the insulation layer, and in which phantom lines illustrate trenches that will be created through both the alternating layers and the insulation layer after patterning and etching a photoresist layer formed over the alternating layers.

FIG. 2 illustrates a process required to form a pedestal structure. The preferred use of the pedestal structure is to form a storage node. A first layer of insulating material, such as BPSG, is formed over gate stacks 16 and source/drain regions 14 therebetween. Other types of insulating materials such as silicon dioxide, borosilicate glass (BSG), or phosphosilicate glass (PSG) are also contemplated to carrying out the intended insulation function. In the embodiment illustrated in FIG. 2, a BPSG layer 18 is used as the first layer of insulating material.

A hard mask layer 19 is formed over BPSG layer 18. Broadly, hard mask layer 19 is a composite multilayer structure comprising a first group of alternating layers of doped material and undoped material. The material of hard mask 19 can be, for example, a silicon containing material, such as polysilicon. In the embodiment illustrated in FIG. 2, alternating layers 20–26 of doped material and undoped material comprise polysilicon.

More specifically, hard mask layer 19 comprises undoped polysilicon layer 20 formed over first layer of insulating material 18. A doped polysilicon layer 22 is formed over undoped polysilicon layer 20. Next, an undoped polysilicon layer 24 is formed over doped polysilicon layer 22. Finally, doped polysilicon layer 26 is formed over undoped polysilicon layer 24. The exact number of alternating layers 20–26 of doped polysilicon and undoped polysilicon is not critical. Other numbers of alternating layers forming hard mask layer 19 can be effective in carrying out the intended function thereof. In the embodiment illustrated in FIG. 2, the preferred thickness of each of the alternating doped and undoped polysilicon layers is a thickness of about 1000 Å for each layer.

One method of forming the alternating layers of doped and undoped polysilicon is to deposit polysilicon during one deposition cycle. During the deposition cycle, a dopant source is alternatingly increased and decreased for a specified time to form both the doped and undoped layers of polysilicon during the deposition cycle. Stated otherwise, the dopant being introduced while the polysilicon is being deposited in turned substantially on and substantially off cyclically during the same deposition cycle to form alternating layers of substantially undoped and substantially doped polysilicon. The dopant can be turned on and off during the deposition cycle for any desired duration.

One of the advantages of the present invention is the ability to form multiple layers of doped and undoped polysilicon in one deposition cycle. It is, however, possible to use other methods to form the alternating doped and undoped layers of material. By way of example only and not by way of limitation, a layer of undoped material can be deposited, followed by the formation of a layer of in situ doped material or a layer that will be implanted with a dopant in order to dope the same. Other methods that can also be used to form alternating layers of doped and undoped material.

Figure 3:
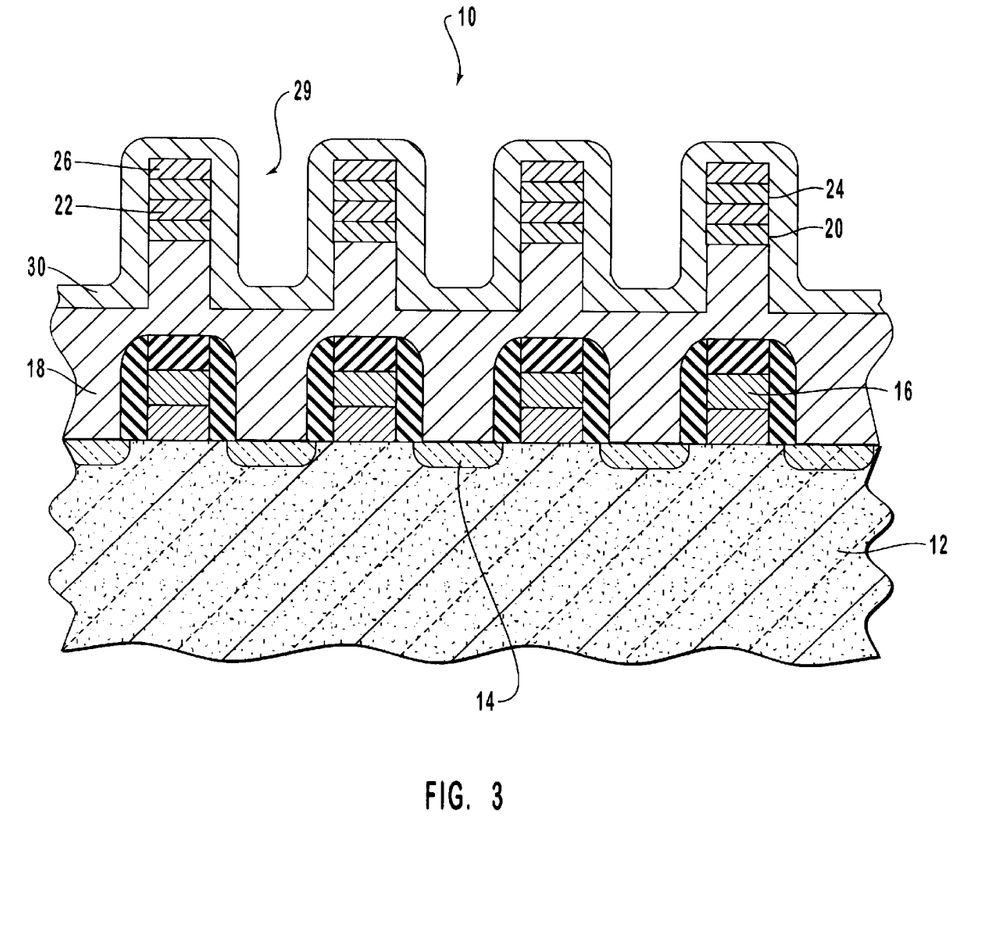
FIG. 3 is a partial cross-sectional elevation view of the structure of FIG. 2 after an etching process to form the trenches and after a layer of doped polysilicon layer is formed thereover.

A contact mask 28 is then formed over hard mask layer 19. One embodiment of contact mask 28 shown in FIG. 2 comprises photoresist material. Contact mask 28 is patterned so as to form trenches 29 which are illustrated in FIG. 2 in phantom. As shown in FIG. 3, an etching process is used to form trenches 29 by removing a portion of BPSG layer 18 and hard mask layer 19, the later of which comprises alternating layers of doped and undoped polysilicon material 20–26. Once the etching process has been completed, contact mask 28 is removed using conventional methods such as stripping. After the etching process, semiconductor substrate 10 has a topographical structure above each gate stack that are each separated by trenches 29 as illustrated in FIG. 3.

A layer of spacer material 30 as shown in FIG. 3, is now deposited over the topographical structures and in trenches 29. Layer of spacer material 30 may comprise either doped or undoped polysilicon. In one embodiment illustrated in FIG. 3, layer of spacer material 30 comprises in situ doped polysilicon.

A portion of layer of spacer material 30 and a portion of BPSG layer 18 are now selectively removed to extend trench 29 into what was space 15 from FIG. 1, thereby forming doped polysilicon spacers 30. Layer of spacer material 30 also narrows trench 29 and consequently the size of a contact plug to be formed above active area 14. The selective removal process is preferably a spacer etch. A suitable wet clean can then be performed.

The spacer etch is then followed by a contact etch to remove any contaminants or oxides that may have formed on silicon base layer 12. The contact etch insures that source/drain region 14 is exposed. The spacer etch and the contact etch may be performed in the same chamber.

Figure 4:
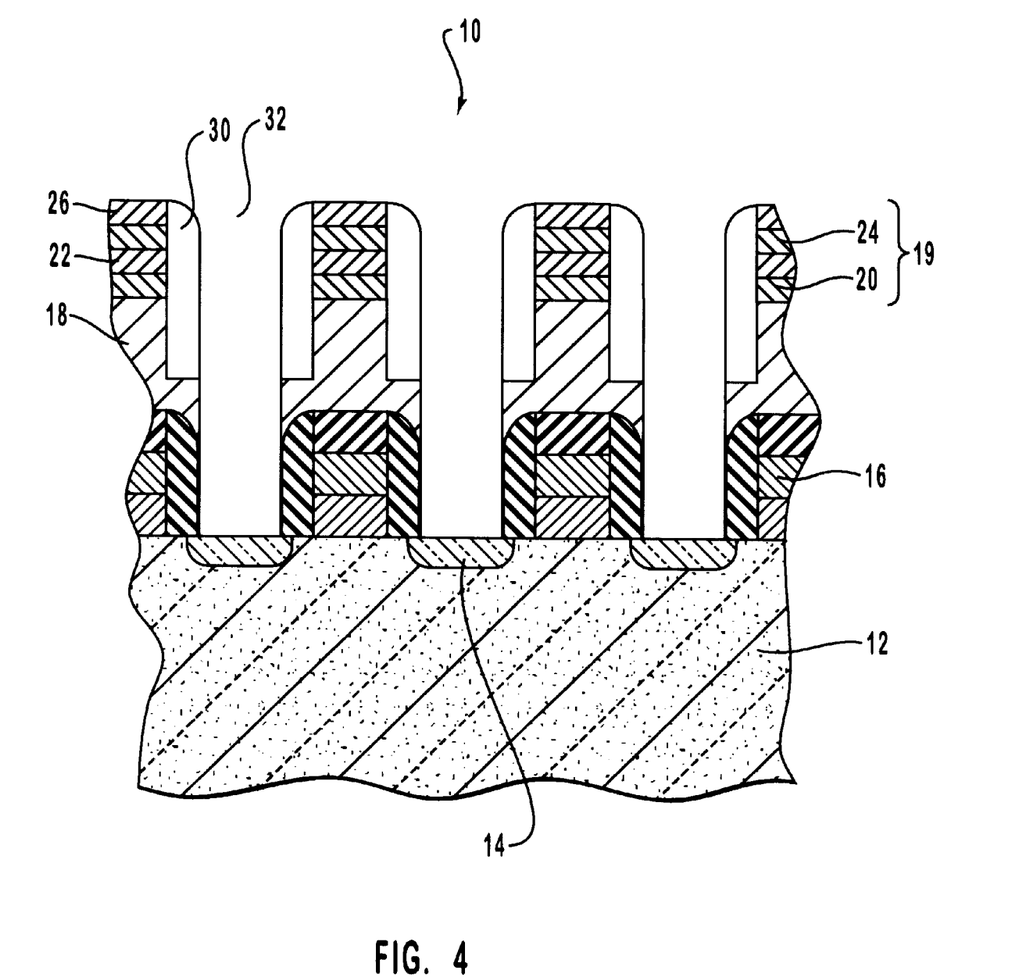
FIG. 4 is a partial cross-sectional elevation view of the structure of FIG. 3 after performing both a spacer etch and a contact etch, thereby creating trenches that expose the source/drain regions and forming topographical structures extending above the pair of gate stacks.

Performing a spacer etch and a contact etch upon semiconductor substrate 10 illustrated in FIG. 3 results in the configuration of semiconductor substrate 10 illustrated in FIG. 4. Trenches 29 seen in FIGS. 1–3 are extended to form recesses 32 which extend from the top of the topographical structures above gate stacks 16 to respective source/drain regions 14. The spacer etch also results in doped polysilicon spacers 30 being formed. Polysilicon spacers 30 are preferably doped in this embodiment because polysilicon spacers 30 form an electrical contact between the fin-like structures that are to be formed and the underlying material connecting the fin-like structures to semiconductor substrate 10.

Figure 5:
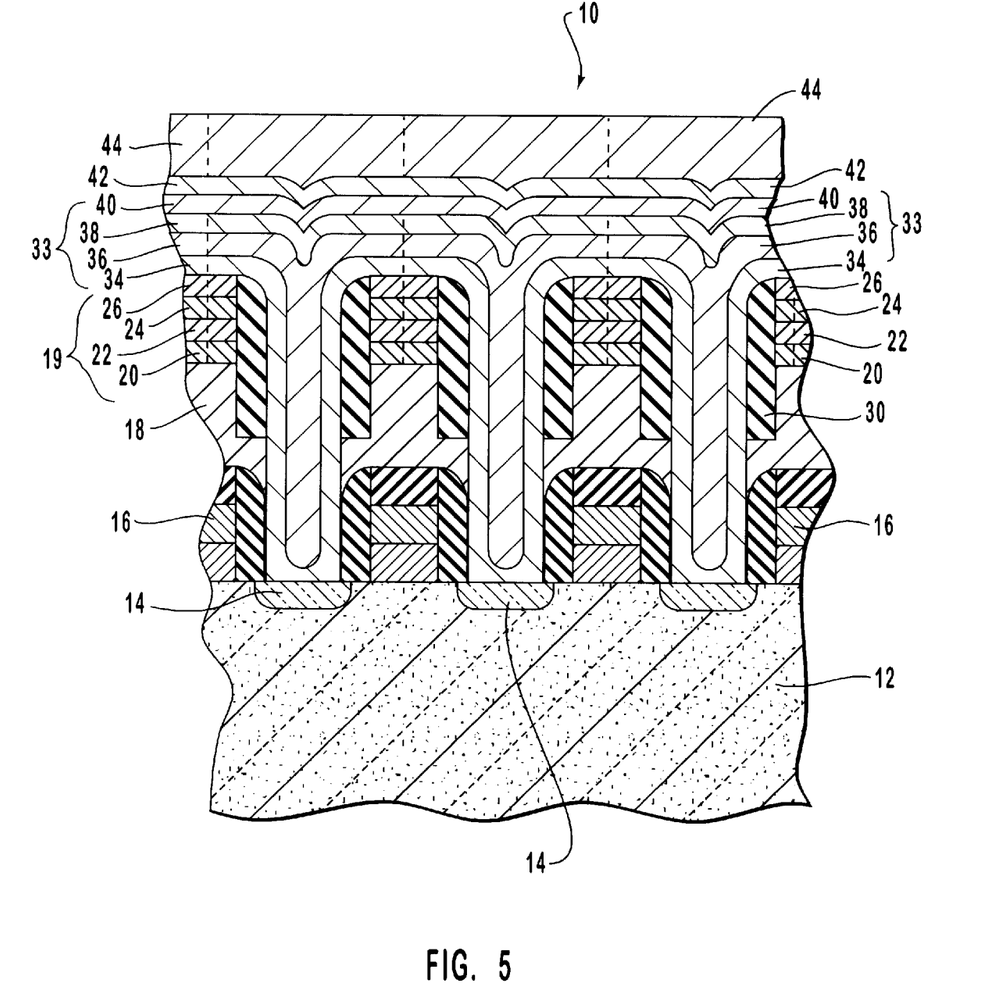
FIG. 5 is a partial cross-sectional elevation view of the structure of FIG. 4 showing a multilayer hard mask layer over the topographical structures and within the trenches, with an optional hemispherical grain (HSG) polysilicon layer and a mask layer formed thereover, and wherein phantom lines show the recesses that will be etched therethrough to define storage nodes.

Next, a second group of alternating layers of doped material and undoped material 33 is formed over the topographical structures above each gate stack 16 and within recess 32 as shown in FIG. 5. In the embodiment illustrated in FIG. 5, second group of alternating layers of doped material and undoped material 33 is substantially composed of polysilicon. A layer 34 is formed over layer 26 of hard mask layer 19, spacers 30, and in recesses 32. Generally, it does not matter if layer 34 comprises doped polysilicon or undoped polysilicon. As with hard mask layer 19, what matters is that second group of alternating layers of doped material and undoped material 33 is made of doped and undoped layers that are alternating. The purpose of the alternating oppositely doped layers it is that a structure is being created which, after a selective etch, will have a desirably increased amount of surface area.

In the embodiment illustrated in FIG. 5, layer 34 is in contact with doped layer 26 of composite multilayer hard mask layer 19 and comprises polysilicon. Layer 34 should also be oppositely doped than doped layer 26 of hard mask layer 19. Layer 34 is an undoped layer and in one embodiment comprises undoped polysilicon.

Undoped layer 34 is followed by doped layer 36. In one embodiment, doped layer 36 comprises doped polysilicon. Similarly, layer 38 will be the opposite in doping of layer 36 and thus must be an undoped layer. Layer 40 is the opposite in doping of layer 38 and thus must be a doped layer. As such, in the embodiment illustrated in FIG. 5, layer 38 is comprised of undoped polysilicon material and layer 40 is comprised of doped polysilicon material.

As with hard mask layer 19, the number of alternating layers is not critical. It is preferred that the thickness of each of the alternating layers be about 1000 Å. It is also preferred that hard mask layer 19, which comprises layers 20–26, together with second group of alternating layers of doped polysilicon and undoped polysilicon 33 comprising layers 34–40 have a total thickness of about 8000 Å.

An optional step in the inventive method is to roughen the exposed surfaces to further increase the surface area of the capacitor storage node. Roughening comprises depositing a thin undoped or lightly doped layer of amorphous silicon over doped polysilicon layer 40 and subjecting the amorphous silicon layer to a high pressure and temperature. The high pressure and temperature results in a nucleation of the amorphous silicon into discrete hemispherical grains (HSG) or spherical grains. An HSG grain size is described as one that is in a range from about 100 Å to about 2,500 Å, preferably from about 200 Å to about 1,000 Å and most preferably from about 200 Å to about 500 Å. Doped polysilicon layer 40 is roughened by depositing a granular material thereon, such as through the formation of a layer of HSG or also through the formation of spherical grain polysilicon (SGP). As shown in FIG. 5, an HSG polysilicon layer 42 is deposited over doped polysilicon layer 40. HSG polysilicon layer 42 is preferably deposited conventionally with a chemical vapor deposition process.

A layer of masking material 44 is then formed over HSG polysilicon layer 42. In the embodiment illustrated in FIG. 5, layer of masking material 44 comprises photoresist material. Layer of masking material 44 is then patterned.

Next, an etch is done through layer of masking material 44 to isolate and define the storage nodes. As illustrated in FIG. 5, prior to the etch, the storage nodes are not yet defined. The recesses that will be formed by the etch are shown in FIG. 5 in phantom. It is preferred that the etch be an anisotropic etch. Most preferably the etch will be an anisotropic dry etch.

Figure 6:
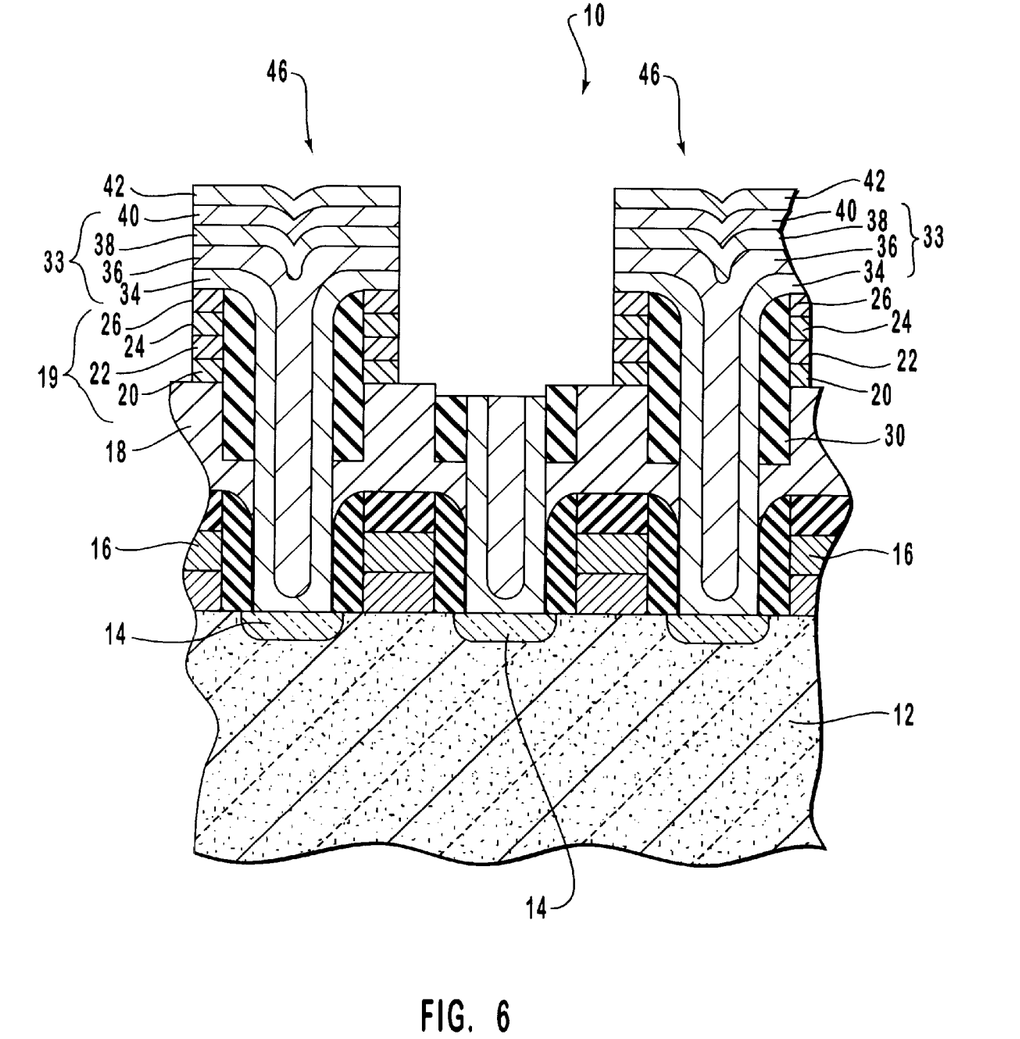
FIG. 6 is a partial cross-sectional elevation view of the structure of FIG. 5 upon completing the etching process which defined the storage nodes.

Once the etch to define the storage nodes has been completed and the remainder of layer of masking material 44 has been removed, the resulting structure is shown in FIG. 6. By way of example only, in FIG. 6 there are two (2) upwardly extending electrically conductive structures or storage nodes 46. Each storage node 46 is separated by a portion of BPSG layer 18.

The structure shown in FIG. 6 is now subjected to an etching process to selectively remove portions of the alternating doped and undoped polysilicon layers. The etch may be selected to be such that portions of doped polysilicon material are removed at a faster rate than the undoped polysilicon material. In contrast, the etch may be selected such that undoped polysilicon material is removed at a faster rate than that of the doped polysilicon material. The type of etch utilized determines which layers will be selectively removed faster than the other according to the dopant concentration of each.

The embodiment illustrated in FIG. 6 can be subjected to an etching process that selectively removes undoped polysilicon layers 20, 24, 34, and 38 at a faster rate than doped polysilicon layers 22, 26, 36, and 40. As such, doped polysilicon layers 22, 26, 36, and 40 have a greater exposed surface area than undoped polysilicon layers 20, 24, 34, and 38. It can be appreciated that one of ordinary skill in the art will be able to select preferred materials for a specific application of the inventive method and will be able to formulate an etch recipe that is selective to either the doped or undoped polysilicon material as is required. It is preferred that the selective etching process be a wet etch. It is also preferred that the selective etching process be isotropic.

Preferably, the selective etching process removes any existing polysilicon stringers. One example of such an etch is a commercially available polysilicon etch that comprises acidic acids, water, and nitric acids. Another example of an etchant to remove the doped polysilicon material at a faster rate than the undoped polysilicon material is a tetramethyl ammonium hydroxide (TMAH) etch.

One example of an etching process which is selective to implanted silicon-containing material comprises a tetramethyl ammonium hydroxide (TMAH) wet etch. The TMAH wet etch is preferably administered as an etchant solution into which semiconductor substrate 10 is immersed.

Preferred concentrations of the TMAH wet etch etchant solution comprise from about 0.1 weight percent TMAH in a deionized water solution and higher. More preferably, a concentration from about 1 to about 10 weight percent TMAH in a solution, and most preferably about 2.5 weight percent TMAH in a solution can be used as the TMAH wet etch etchant solution. The TMAH wet etch is preferably conducted at a temperature in a range from about 5° C. to about 50° C., and more preferably, in a range from about 20° C. to about 30° C. Most preferably, the TMAH wet etch is conducted at about 30° C.

The doped polysilicon layers will preferably have a dopant concentration in a range from about $1\times10^{15}$ ions per $cm^3$ of polysilicon to about $1\times10^{22}$ ions per $cm^3$ of polysilicon. More preferably, the threshold concentration is in a range from about $5\times10^{18}$ ions per $cm^3$ of polysilicon to about $5\times10^{19}$ ions per $cm^3$ of polysilicon. Most preferably the threshold concentration is about $1\times10^{19}$ ions per $cm^3$ of polysilicon.

Figure 7:
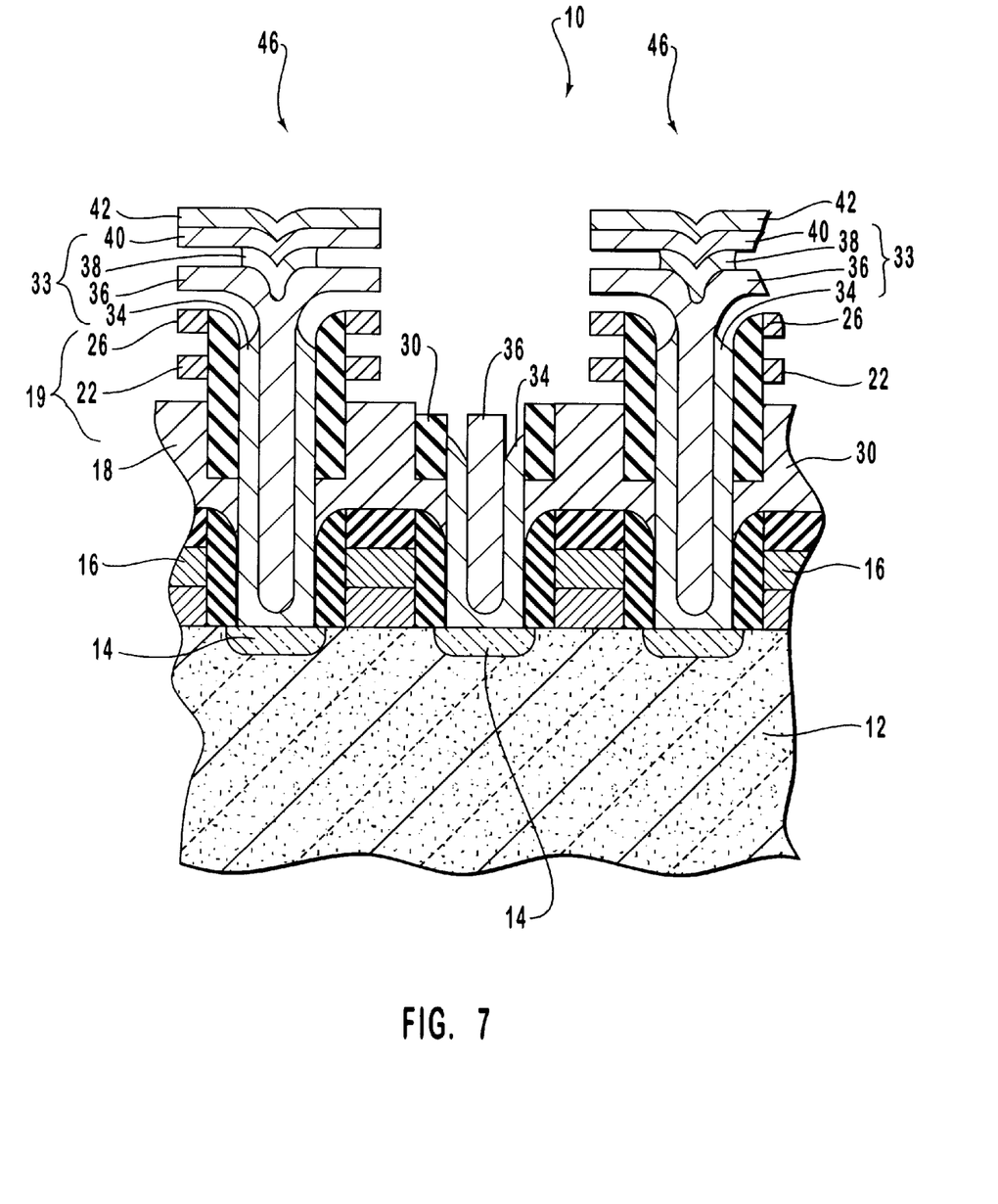
FIG. 7 is a partial cross-sectional elevation view of the structure of FIG. 6 after a selective etching process in which one of the alternating layers of doped polysilicon or undoped polysilicon is removed at a rate faster than the other, thereby creating portions of one of the alternating layers having a spaced apart relationship.

The completion of the etching process results in the structure illustrated in FIG. 7. As shown, fin-like structures exhibit spaced apart layers of exposed doped polysilicon material. As such, the resultant formation has substantially more doped polysilicon material than undoped polysilicon material.

Those embodiments that utilize HSG polysilicon layer 42, such as the embodiment illustrated in FIG. 7, are now subjected to an isotropic etch to remove all of HSG polysilicon layer 42 on the storage nodes. The etching process preferably removes all of the HSG polysilicon layer 42 and thereby transfers the surface roughness of the HSG to portions of second group of alternating layers of doped polysilicon and undoped polysilicon 33, thereby giving it all a rough surface texture. The rough surface texture increases the surface area of storage node 46. Semiconductor substrate 10 is now annealed to diffuse the dopant from doped layers of polysilicon to the undoped layers of polysilicon so that the entire structure is substantially composed of doped polysilicon that forms an electrical connection with source/drain regions 14.

Figure 8:
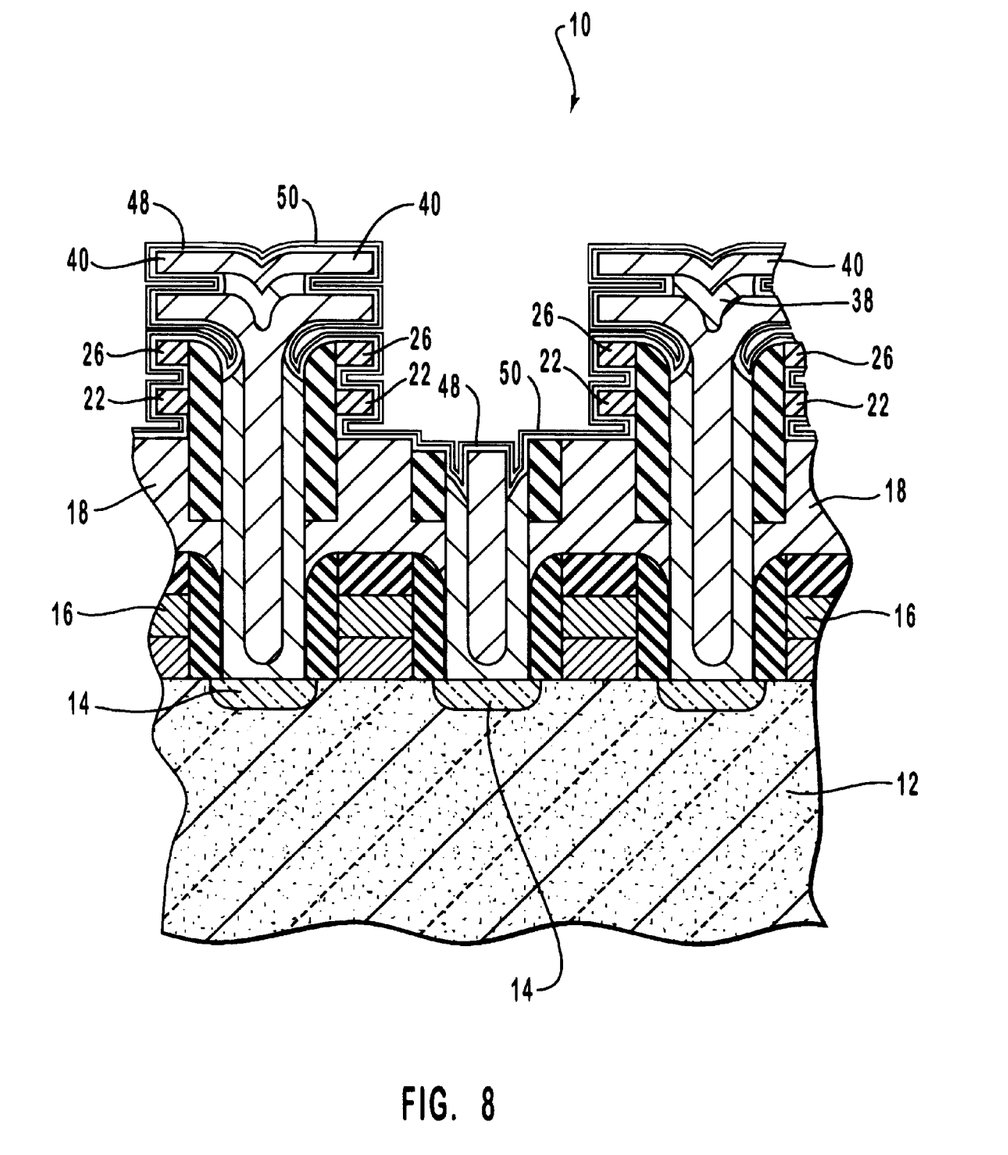
FIG. 8 is a partial cross-sectional elevation view of the substrate of FIG. 7 after a dielectric layer and cell plate have been formed over the storage nodes to complete the capacitor structure.

As shown in FIG. 8, a dielectric layer 48 is formed over storage node 46. Dielectric layer 48 is formed of silicon nitride or barium strontium titanate, and the like, but preferably is formed of silicon nitride. After the formation of dielectric layer 48, a cell plate 50 is conventionally formed over dielectric layer 48. Cell plate 50 is preferably composed of polysilicon. In the embodiment illustrated in FIG. 8, cell plate 50 comprises doped polysilicon.

A contact plug in electrical communication with source/drain region 14 is accomplished by subsequent conventional processing, such as etching down through dielectric layer 48 and cell plate 50 to the remaining polysilicon fin above source/drain region 14 and between storage nodes 46 using a refractory metal plug or polycide. The preferred material for forming the contact plug is tungsten.

From the foregoing disclosure, it can be seen that the present invention provides an improved method of forming storage nodes 46. One of the reasons for forming the alternating layers of doped and undoped polysilicon is that later in the process semiconductor substrate 10 undergoes an etch that is capable of selectively removing one or the other of alternated layers of doped or undoped polysilicon material at a rate faster that the remaining layer is removed. This results in layers having a spaced apart relationship. Whether it is the undoped polysilicon layer or the doped polysilicon layer that is removed at the faster rate is dependent upon the chemistry of the etch that is utilized. The etch creates staggered structures, thereby increasing the exposed surface area. The resulting storage nodes 46 have a plurality of fin-like structures similar to those common to a heat exchanger. The increased surface area enables a charge to be better maintained so that time between refreshes is longer.

An advantage of the invention is that the alternating layers of doped and undoped polysilicon material can be formed in one deposition cycle during which the dopant is repeatively increased and decreased or turned on and off. An additional advantage is that the alternating layers of doped and undoped polysilicon material are part of the hard mask layer used to form the in situ contact. This results in a reduction in mask size from that which is normally possible. Using spacer technology, the present inventive method is able to form dimensions below 0.25 microns.

The present invention may be embodied in other specific forms without departing from its spirit or essential characteristics. The described embodiments are to be considered in all respects only as illustrated and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A method of making a capacitor structure comprising:
    providing a space extending between a pair of gate stacks on a semiconductor substrate to expose a charge conducting region formed therein;
    forming a layer of insulating material within said space and over said pair of gate stacks, said layer of insulating material substantially filling said space between said gate stacks;
    forming a hard mask layer over said layer of insulating material, said hard mask layer comprising a first group of alternating layers of a doped material and an undoped material, said first group of alternating layers of said doped material and said undoped material being formed during one deposition cycle;
    selectively removing a portion of said hard mask layer and a portion of said layer of insulating material, thereby forming a topographical structure projecting from each of said gate stacks, said topographical structures having a trench therebetween;
    depositing another layer over said topographical structures and in said trench therebetween;
    selectively removing a portion of said layer of insulating material and a portion of said another layer, thereby forming a recess which exposes said charge conducting region between said pair of gate stacks;
    forming a second group of alternating layers of said doped material and said undoped material over said topographical structures and in said recess, said second group of alternating layers of said doped material and said undoped material being formed during one deposition cycle;
    selectively removing portions of said doped material and said undoped material that are situated above the charge conducting region and between the pair of gate stacks; and
    selectively removing a greater portion of said doped material or said undoped material, thereby increasing the exposed surface area of the other of said doped material or said undoped material, respectively, and thereby forming a capacitor storage node adjacent to and in contact with each said gate stack, said capacitor storage node having alternating layers of said doped material and said undoped material.

2. A method as recited in claim 1, wherein said another layer comprises an in situ doped polysilicon layer.

3. A method as recited in claim 1 wherein said another layer forms a spacer on a lateral side of each said topographical structure formed.

4. A method as recited in claim 1, wherein each of said alternating layers of said first and second group have a thickness of about 1000 Å.

5. A method as recited in claim 1, wherein said layer of insulating material comprises BPSG.

6. A method as recited in claim 1, wherein forming said recess which exposes said charge conducting region comprises an etching process.

7. A method as recited in claim 6, wherein:
    said another layer is composed of doped polysilicon; and
    said etching process comprises:
        a spacer etch selective to doped polysilicon followed by a contact etch which exposes said charge conducting region.

8. A method as recited in claim 7, wherein said spacer etch and said contact etch are performed in a single etching chamber.

9. A method as recited in claim 7, wherein said spacer etch is a dry etching process.

10. A method as recited in claim 1, wherein said first and second groups of alternating layers are formed by depositing polysilicon while:

introducing a dopant for doping the polysilicon being deposited and formed; and varying the concentration of the dopant being introduced.

11. A method as recited in claim 1, wherein said first and second groups of alternating layers are formed by depositing polysilicon while alternatingly turning a dopant source substantially on and substantially off during a single deposition of polysilicon.

12. A method as recited in claim 1, wherein said doped material is formed using an ion implantation process.

13. A method as recited in claim 1, wherein selectively removing said greater portion of one of said doped material and said undoped material is a wet etch using an etchant comprising from about at least 0.1 weight percent TMAH in a deionized water solution and higher.

14. A method as recited in claim 1, further comprising:
forming a capacitor dielectric layer over said doped material and said undoped material; and
forming a capacitor cell plate over said capacitor dielectric layer.

15. A method as recited in claim 1, further comprising:
heat treating said doped material and said undoped material so as to diffuse dopant from said doped material to said undoped material.

16. A method of making a capacitor comprising:
providing a space extending between a pair of gate stacks on a semiconductor substrate to expose a charge conducting region formed therein;
forming a BPSG layer in said space and over said pair of gate stacks, said BPSG layer substantially filling said space between said gate structures;
forming a hard mask layer over said BPSG layer, said hard mask layer comprising a first group of alternating layers of doped polysilicon and undoped polysilicon formed during one deposition cycle of polysilicon during which a dopant is turned substantially on and substantially off;
selectively removing a portion of said hard mask layer and a portion of said BPSG layer, thereby forming topographical structures having a trench therebetween;
depositing a layer of in situ doped polysilicon over said topographical structures and in said trench therebetween;
spacer etching said BPSG layer and a portion of said layer of in situ doped polysilicon, said spacer etch forming a doped spacer on a lateral side of each said topographical structure;
contact etching to form a recess which exposes said charge conducting region;
forming a second group of alternating layers of doped polysilicon and undoped polysilicon over said topographical structures and in said recess, said second group of said alternating layers of doped polysilicon and undoped polysilicon being formed during one deposition cycle of polysilicon during which a dopant is turned substantially on and substantially off;
selectively removing a portion of said hard mask layers and a portion of said second group of said alternating layers of doped polysilicon and undoped polysilicon thereby forming a storage node adjacent to and in contact with each said gate stack, said storage node having alternating layers of doped polysilicon and undoped polysilicon;
etching said alternating layers of doped polysilicon and undoped polysilicon of said storage node to remove therefrom a portion of said undoped polysilicon layers utilizing an etchant selective to said doped polysilicon layers of said storage node;
forming a dielectric layer over said alternating layers of doped polysilicon and undoped polysilicon of said storage node; and
forming an electrically conductive cell plate upon said dielectric layer.

17. A method as recited in claim 16, further comprising, prior to forming each said storage node, forming a layer of granular polysilicon over said second group of alternating layers of said doped polysilicon and said undoped polysilicon, wherein said layer of granular polysilicon comprises a material selected from the group consisting of HSG polysilicon and sperical grain polysilicon, and wherein said step of selectively removing a portion of said hard mask layer and a portion of said second group of said alternating layers of doped polysilicon and said undoped polysilicon also removes a portion of said layer of granular polysilicon.

18. A method as recited in claim 17, where in said spacer etch process and said contact etch process are preformed in a single chamber, wherein said spacer etch is a dry etching process.

19. A method as recited in claim 17, further comprising heating treating said storage nodes, thereby diffusing dopant from said doped polysilicon into said undoped polysilicon.

20. A method as recited in claim 17, wherein each of said layers of said hard mask layer and said second group of alternating layers of said doped polysilicon and said undoped polysilicon together have a combined total thickness of about 8000 Å.

21. A method of forming a capacitor storage node comprising:
providing an electrically insulative material upon a semiconductor substrate;
forming on the electrically insulative material a first material having:
a highly doped portion; and
a lowly doped portion;
selectively removing said first material faster for one of:
the highly doped portion; or
the lowly doped portion;
forming a trench having side walls that extend through the first material and the electrically insulative material to terminate at the semiconductor substrate;
forming a second material within and above the trench, said second material having:
a highly doped portion; and
a lowly doped portion;
selectively removing said second material faster for one of
the highly doped portion; or
the lowly doped portion;
whereby a capacitor storage node is formed from the first and second materials.

22. The method as defined in claim 21, further comprising, after forming said trench and prior to forming said second material:
forming a spacer on a portion of the side walls of the trench.

23. The method as defined in claim 21, further comprising:
forming a capacitor dielectric layer over said first and second materials; and forming a capacitor cell plate over said capacitor dielectric layer.

24. The method as defined in claim 21, further comprising:
  forming a pair of gate stacks upon the semiconductor substrate;
  wherein the trench is situated between and is defined in part by the pair of gate stacks.

25. A method as recited in claim 21, further comprising:
  heat treating said first and second materials until substantially all of the first and second materials are doped with said first and second dopants.

26. A method as recited in claim 21, wherein said first and second materials are formed by depositing polysilicon while:
  introducing said first and second dopants, respectively, for doping the polysilicon being deposited and formed; and
  varying the concentration of said first and second dopants, respectively, being introduced.

27. A method as recited in claim 21, wherein said first and second materials are doped, respectively, with the first and second dopants by an ion implantation process.

28. A method as recited in claim 21, wherein the steps of selectively removing said first material and selectively removing said second material form alternating doped and undoped layers in the capacitor storage node.

29. A method of forming a capacitor structure the method comprising:
  forming an electrically insulative material on a semiconductor substrate;
  forming an alternatingly doped first material upon the electrically insulative material;
  selectively removing the first material to form a first set of alternatingly doped fins;
  forming a trench that extends through the first material and the electrically insulative material and that terminates at the semiconductor substrate;
  forming an alternatingly doped second material within and above the trench;
  selectively removing the second material to form a second set of alternatingly doped fins, whereby a capacitor storage node is formed from the first and second materials.

30. The method as defined in claim 29, further comprising, after forming said trench and prior to forming said second material:
  forming a spacer on a portion an inside wall of the trench.

31. The method as defined in claim 29, further comprising:
  forming a capacitor dielectric layer over said first and second materials; and
  forming a capacitor cell plate over said capacitor dielectric layer.

32. The method as defined in claim 29, further comprising:
  forming a pair of gate stacks upon the semiconductor substrate;
  wherein the trench is situated between the pair of gate stacks.

33. A method as recited in claim 29, further comprising:
  heat treating said first and second materials until substantially all of the first and second materials are doped with the dopants by which the first and second materials are alternatingly doped.

34. A method as recited in claim 29, wherein said first and second materials are formed by depositing polysilicon while:
  introducing a dopant for doping the polysilicon being deposited; and
  varying the concentration of the dopant being introduced.

35. A method as recited in claim 29, wherein:
  forming an alternatingly doped first material further comprises alternatingly doping the first material by an ion implantation process; and
  forming an alternatingly doped second material further comprises alternatingly doping the second material by an ion implantation process.

* * * * *

UNITED STATES PATENT AND TRADEMARK OFFICE
CERTIFICATE OF CORRECTION

PATENT NO. : 6,027,967
DATED : February 22, 2000
INVENTOR(S) : Kunal R. Parekh, Zhiqiang Wu and Li Li It is certified that error appears in the above-identified patent and that said Letters Patent is hereby corrected as shown below:

Title page,
Item [56], OTHER PUBLICATIONS, change "Schnakenberg" to -- U. Schnakenberg --
Item [57], ABSTRACT,
Line 1, delete "comprising"

Column 3,
Line 61, change "polysiliCon" to -- polysilicon --

Column 4,
Line 1, after "area," change "an" to -- and --

Column 5,
Line 67, after "deposited" change "in" to -- is --

Column 6,
Line 27, change "are each" to -- is --
Line 64, after "FIG. 5," insert -- the -- or -- a --

Column 7,
Line 6, after "layers" delete -- it --

Column 9,
Line 34, after "faster" change "that" to -- than --
Line 46, after "is" change "repeatively" to -- repeatedly --

Column 11,
Line 6, after "while" change "altematingly" to -- alternatingly --
Line 63, after "stack," insert -- each --

UNITED STATES PATENT AND TRADEMARK OFFICE
CERTIFICATE OF CORRECTION

PATENT NO.   : 6,027,967
DATED        : February 22, 2000
INVENTOR(S)  : Kunal R. Parekh, Zhiqiang Wu and Li Li

It is certified that error appears in the above-identified patent and that said Letters Patent is hereby corrected as shown below:

<u>Column 12,</u>
Line 15, change "sperical" to -- spherical --
Line 20, change "where in" to -- wherein --
Line 25, change "heating" to -- heat --

<u>Column 14,</u>
Line 4, after "portion" insert -- of --

Signed and Sealed this

Twenty-eighth Day of January, 2003

JAMES E. ROGAN
*Director of the United States Patent and Trademark Office*